(12) United States Patent
Hshieh et al.

(10) Patent No.: US 7,622,787 B2
(45) Date of Patent: Nov. 24, 2009

(54) PROCESS FOR HIGH VOLTAGE SUPERJUNCTION TERMINATION

(75) Inventors: Fwu-Iuan Hshieh, Saratoga, CA (US); Brain D. Pratt, San Jose, CA (US)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 37 days.

(21) Appl. No.: 12/104,137

(22) Filed: Apr. 16, 2008
(Under 37 CFR 1.47)

(65) Prior Publication Data

US 2008/0283956 A1 Nov. 20, 2008

Related U.S. Application Data (62) Division of application No. 11/318,873, filed on Dec. 27, 2005, now Pat. No. 7,354,818.

(60) Provisional application No. 60/639,241, filed on Dec. 27, 2004.

(51) Int. Cl.
*H01L 23/58* (2006.01)
(52) U.S. Cl. .............................. 257/493; 257/E29.007; 257/E21.546; 438/427
(58) Field of Classification Search ........................ None
See application file for complete search history.

(56) References Cited

U.S. PATENT DOCUMENTS

| | | |
|---|---|---|
| 4,158,206 A | 6/1979 | Neilson |
| 4,211,582 A | 7/1980 | Horng et al. |
| 4,238,278 A | 12/1980 | Antipov |
| 4,491,486 A | 1/1985 | Iwai |
| 4,895,810 A | 1/1990 | Meyer et al. |
| 4,994,406 A | 2/1991 | Vasquez et al. |
| 5,019,522 A | 5/1991 | Meyer et al. |
| 5,045,903 A | 9/1991 | Meyer et al. |
| 5,216,275 A | 6/1993 | Chen |
| 5,308,786 A | 5/1994 | Lur et al. |
| 5,366,914 A | 11/1994 | Takahashi et al. |
| 5,395,790 A | 3/1995 | Lur |
| 5,432,113 A | 7/1995 | Tani |
| 5,435,888 A | 7/1995 | Kalnitsky et al. |
| 5,472,888 A | 12/1995 | Kinzer |
| 5,506,421 A | 4/1996 | Palmour |
| 5,598,018 A | 1/1997 | Lidow et al. |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,926,713 A | 7/1999 | Hause et al. |
| 5,929,690 A | 7/1999 | Williams |

(Continued)

*Primary Examiner*—Zandra Smith
*Assistant Examiner*—Khanh B Duong
(74) *Attorney, Agent, or Firm*—Panitch Schwarze Belisario & Nadel LLP (57) ABSTRACT

A method of manufacturing a semiconductor device having an active region and a termination region includes providing a semiconductor substrate having first and second main surfaces opposite to each other. The semiconductor substrate has an active region and a termination region surrounding the active region. The first main surface is oxidized. A first plurality of trenches and a first plurality of mesas are formed in the termination region. The first plurality of trenches in the termination region are filled with a dielectric material. A second plurality of trenches in the termination region. The second plurality of trenches are with the dielectric material.

3 Claims, 12 Drawing Sheets

U.S. PATENT DOCUMENTS

| | | |
|---|---|---|
| 5,939,754 A | 8/1999 | Hoshi |
| 6,008,106 A | 12/1999 | Tu et al. |
| 6,081,009 A | 6/2000 | Neilson |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Hebert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usui et al. |
| 6,452,230 B1 | 9/2002 | Boden, Jr. |
| 6,459,142 B1 | 10/2002 | Tihanyi |
| 6,465,325 B2 | 10/2002 | Ridley et al. |
| 6,479,354 B2 | 11/2002 | Moon |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,613,644 B2 | 9/2003 | Lachner |
| 6,635,906 B1 | 10/2003 | Chen |
| 6,797,589 B2 | 9/2004 | Adams et al. |
| 7,109,110 B2 * | 9/2006 | Hshieh .................. 438/653 |
| 2002/0070418 A1 | 6/2002 | Kinzer et al. |
| 2005/0139914 A1 | 6/2005 | Blanchard |
| 2005/0176192 A1 | 8/2005 | Hshieh |
| 2005/0181558 A1 | 8/2005 | Hshieh |
| 2005/0181564 A1 | 8/2005 | Hshieh et al. |
| 2005/0181577 A1 | 8/2005 | Hshieh |

* cited by examiner

PROCESS FOR HIGH VOLTAGE SUPERJUNCTION TERMINATION

CROSS-REFERENCE TO RELATED APPLICATIONS

This application is a divisional application of U.S. patent application Ser. No. 11/318,873, filed Dec. 27, 2005, currently pending, which claims priority to U.S. Provisional Patent Application No. 60/639,241, filed Dec. 27, 2004, entitled "Process for High Voltage Superjunction Termination."

BACKGROUND OF THE INVENTION

The present invention relates to a method for manufacturing a semiconductor device having a termination region, and in particular to a method of manufacturing a semiconductor device having a dielectric region for enhancement of device reverse voltage blocking capability.

Since the invention of superjunction devices by Dr. Xingbi Chen, as disclosed in U.S. Pat. No. 5,216,275, there have been many attempts to expand and improve on the superjunction effect of his invention. U.S. Pat. Nos. 6,410,958, 6,300,171 and 6,307,246 are examples of such efforts and are incorporated herein by reference.

U.S. Pat. No. 6,410,958 ("Usui, et al.") relates to an edge termination structure and a drift region for a semiconductor component. A semiconductor body of one conductivity type has an edge area with a plurality of regions of the other conductivity type embedded in at least two mutually different planes. Underneath the active zone of the semiconductor component the drift regions are connected using the underlying substrate.

U.S. Pat. No. 6,307,246 ("Nitta, et al.") discloses a power semiconductor component having a high-voltage sustaining edge structure in which a multiplicity of parallel-connected individual components are disposed in a multiplicity of cells of a cell array. In an edge region, the semiconductor component has cells with shaded source zone regions. During commutation of the power semiconductor component, the shaded source zone regions suppress the switching "on" of a parasitic bipolar transistor caused by the disproportionately large reverse flow current density. Moreover, an edge structure having shaded source zone regions can be produced very easily in technological terms that are discussed in the Nitta, et al. patent. It clarifies the effects of parameters and enables the mass production of a superjunction semiconductor device which has a drift layer composed of a parallel pn layer that conducts electricity in the "on" state and is depleted in the "off" state. The net quantity of active impurities in the n-type drift regions is within the range of 100% to 150% of the net quantity of active impurities in the p-type partition regions. In addition, the width of either one of the n-type drift regions and the p-type partition regions is within the range between 94% and 106% of the width of the other regions.

U.S. Pat. No. 6,300,171 ("Frisina") discloses a method for manufacturing an edge structure for a high voltage semiconductor device, including a first step of forming a first semiconductor layer of a first conductivity type, a second step of forming a first mask over the top surface of the first semiconductor layer, a third step of removing portions of the first mask in order to form at least one opening in the mask, a fourth step of introducing dopant of a second conductivity type in the first semiconductor layer through the at least one mask opening, a fifth step of completely removing the first mask and of forming a second semiconductor layer of the first conductivity type over the first semiconductor layer, and a sixth step of diffusing the dopant implanted in the first semiconductor layer in order to form a doped region of the second conductivity type in the first and second semiconductor layers. The second step up to the sixth step are repeated at least one time in order to form a final edge structure including a number of superimposed semiconductor layers of the first conductivity type and at least two columns of doped regions of the second conductivity type, the columns being inserted in the number of superimposed semiconductor layers and formed by superimposition of the doped regions subsequently implanted through the mask openings, the columns near the high voltage semiconductor device being deeper than the columns farther from the high voltage semiconductor device.

It is desirable to provide a method of manufacturing a high voltage semiconductor device having an oxide region for enhancement of device reverse voltage blocking capability.

BRIEF SUMMARY OF THE INVENTION

Briefly stated, the present invention comprises a semiconductor device and a method of manufacturing a semiconductor device. The semiconductor device has an active region and a termination region. The method of manufacturing the semiconductor device includes providing a semiconductor substrate having first and second main surfaces opposite to each other. The semiconductor substrate has a heavily doped region of a first conductivity type at the second main surface and a lightly doped region of the first conductivity type at the first main surface. The semiconductor substrate has an active region and a termination region surrounding the active region. The first main surface is oxidized. A first plurality of trenches and a first plurality of mesas are formed in the termination region. Each trench of the first plurality of trenches extends from the first main surface toward the heavily doped region to a first depth position. The first plurality of trenches in the termination region are filled with a dielectric material. A second plurality of trenches is formed in the termination region. Each trench of the second plurality of trenches extends from the first main surface toward the heavily doped region to a second depth position. The second plurality of trenches are filled with a dielectric material.

The present invention also comprises a semiconductor device and a method of manufacturing a semiconductor device. The semiconductor device has an active region and a termination region. The method of manufacturing the semiconductor device includes providing a semiconductor substrate having first and second main surfaces opposite to each other. The semiconductor substrate has a heavily doped region of a first conductivity type at the second main surface and has a lightly doped region of the first conductivity type at the first main surface. A trench is formed in the termination region. The trench extends from the first main surface toward the heavily doped region to a first depth position. The trench is greater than 20 micrometers wide and is filled with an oxide material.

The present invention also comprises a semiconductor device and a method of manufacturing a semiconductor device. The semiconductor device has an active region and a termination region. The method of manufacturing the semiconductor device includes providing a semiconductor substrate having first and second main surfaces opposite to each other. The semiconductor substrate has a heavily doped region of a first conductivity type at the second main surface and has a lightly doped region of the first conductivity type at the first main surface. A plurality of trenches and a plurality of mesas are formed in the termination region. Each trench of the plurality of trenches extends from the first main surface toward the heavily doped region to a first depth position. The plurality of mesas in the termination region are oxidized until the plurality of mesas are sufficiently converted to an oxide material. The plurality of trenches in the termination region are filled with an oxide.

The present invention also comprises a semiconductor device and a method of manufacturing a semiconductor device. The semiconductor device has an active region and a termination region. The method of manufacturing the semiconductor device includes providing a semiconductor substrate having first and second main surfaces opposite to each other. The semiconductor substrate has a heavily doped region of a first conductivity type at the second main surface. An oxide substrate having first and second main surfaces opposite to each other is also provided. The second main surface of the oxide substrate is bonded/annealed to the first main surface of the semiconductor substrate. A trench is formed in the oxide substrate proximate the active region. The trench extends from the first main surface of the oxide substrate to the first main surface of the semiconductor substrate. The trench is filled with an epitaxial layer.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For purposes of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the words "a" and "an," as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

FIGS. 1-16 generally show a process for manufacturing a superjunction semiconductor device with conventional terminations in accordance with a preferred embodiment of the present invention.

Figure 1:
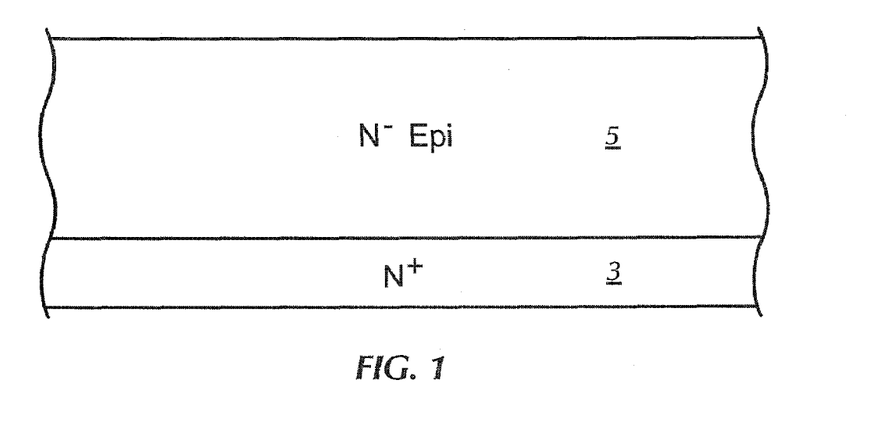
FIG. 1 is a partial sectional elevational view of a semiconductor substrate with an epitaxial layer applied.

Referring to FIG. 1, there is shown a partial view of a semiconductor wafer that includes a heavily doped $n^+$ substrate 3 and a lightly doped $n^-$ layer 5. Preferably, the semiconductor substrate is formed of silicon (Si). But, the semiconductor substrate may be formed of other materials such as gallium arsenide (GaAs), germanium (Ge) or the like.

Figure 2:
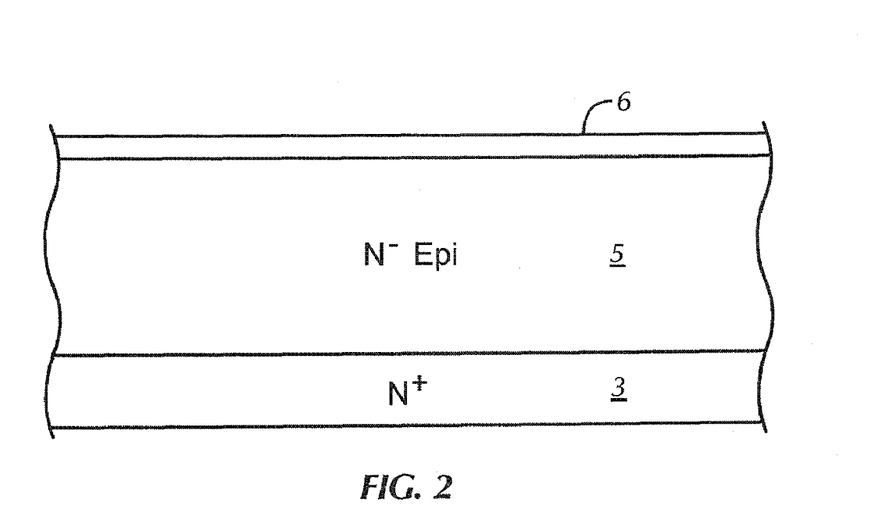
FIG. 2 is a partial sectional elevational view of the partially formed semiconductor device of FIG. 1 after deposition of a layer of oxide.
Figure 3:
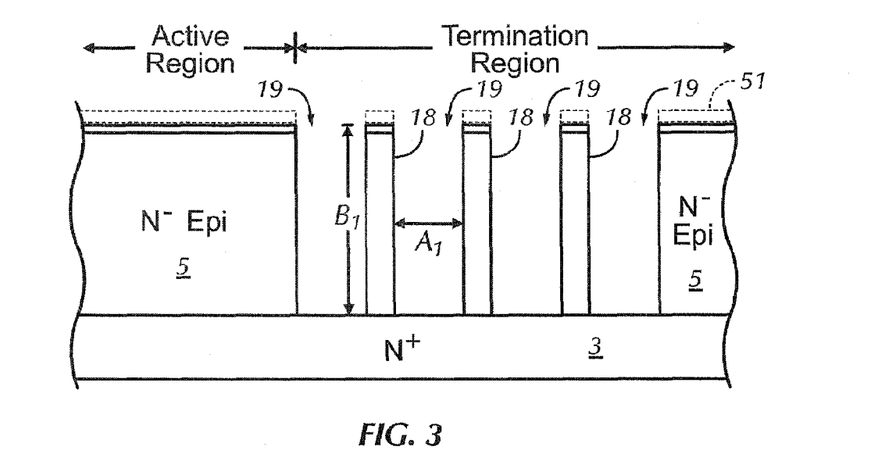
FIG. 3 is a partial sectional elevational view of the partially formed semiconductor device of FIG. 2 after a mask is applied and an etching step performed.

FIG. 2 shows that an oxide layer 6 is grown or deposited on the surface of the lightly-doped $n^-$ layer 5. Referring to FIG. 3, a first mask 51 (shown in phantom) is selectively applied over the partially formed semiconductor device of FIG. 2. The first mask 51 may be created by deposition of a layer of photoresist or in some other manner well known to those skilled in the art. The developed photoresist is removed and undeveloped photoresist remains in place as is known in the art. For simplification, the mask 51 refers to the material used to prevent certain areas of a semiconductor from being etched, doped, coated or the like.

Trenches 19 are formed in the areas not covered by the first mask 51 by a process such as etching. The etching process can be a chemical etch, a plasma etch, a Reactive Ion Etch (RIE) or the like. The etching of the partially formed semiconductor device of FIG. 2 creates a plurality of mesas 18 and a plurality of trenches 19 in a termination region of the partially formed semiconductor device. The trenches 19 extend from the first main surface of the epitaxial layer 5 toward the substrate (heavily doped region) 3 to a first depth position illustrated by depth $B_1$, but not necessarily all the way to the substrate (heavily doped region) 3. The width $A_1$ of each of the trenches 19 adjacent to mesas 18 is about the same relative to the other trenches 19. The partially formed semiconductor device includes an active region within the termination region. The active region is the area in which superjunction devices are constructed. The termination region is the area where no active devices are located, providing isolation between cells of active devices on an overall semiconductor wafer or chip. Thus, the active region is the area on which semiconductor devices will be formed, and the termination region is an area which provides insulation between cells of active devices. After the first trenching process, the first mask 51 is removed using techniques known in the art.

Figure 4:
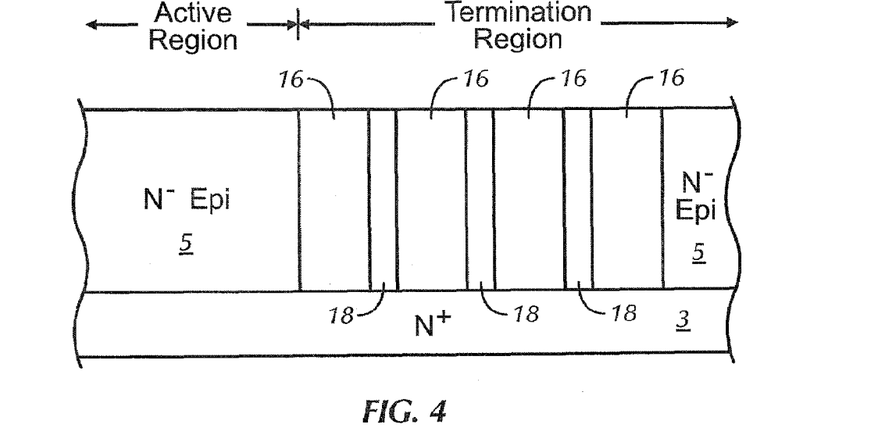
FIG. 4 is a partial sectional elevational view of the partially formed semiconductor device of FIG. 3 after an oxide deposition fills the trenches etched in FIG. 3 and the resulting surface is planarized.

FIG. 4 shows that the trenches 19 (FIG. 3) previously etched in the termination region are filled with oxide 16 in a manner well known in the art. Optionally, a thin layer of dielectric such as silicon nitride ($Si_xN_y$) may be deposited over the oxide 16. After a sufficient cooling period, the partially formed semiconductor device is planarized. The planarizing may be performed using chemical mechanical polishing (CMP) or any other suitable planarization technique.

Figure 5:
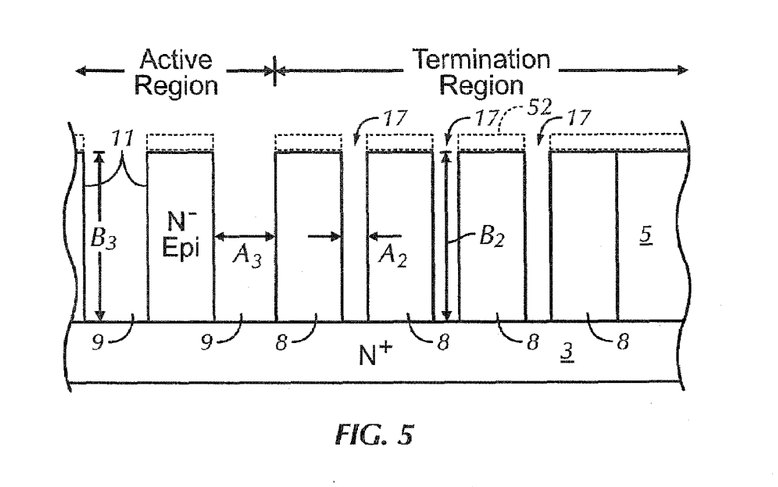
FIG. 5 is a partial sectional elevational view of the partially formed semiconductor device of FIG. 4 after applying a second mask and performing an etch step.

Referring to FIG. 5, a second mask 52 (shown in phantom) is selectively applied over the partially formed semiconductor device of FIG. 4. Trenches 9, 17 are formed in the areas not covered by the second mask 52 by a process such as etching. The etching process can be a chemical etch, a plasma etch, an RIE or the like. The second masking and etching step removes the remaining epitaxial material in the termination region to form trenches 17 between the oxide columns 8 created in the previous filling step, and creates trenches 9 and mesas 11 in the active region of the structure. The $n^-$ layer 5 is etched so that the bottom of an etched trench 9, 17 touches or approaches the interface between the $n^+$ substrate 3 and the $n^-$ layer 5. The trenches 17 extend from the first main surface toward the substrate 3 to a second depth position illustrated by depth $B_2$, but not necessarily all the way to the substrate 3. The width $A_2$ of each of the trenches 17 adjacent to the oxide columns 8 is about the same relative to the other trenches 17.

The mesas 11 are referred to as "device mesas" because the mesas 11 are in the active region, as opposed to the surrounding termination region. The device mesas 11 will be used to form the voltage sustaining layer for each transistor or active device cell manufactured by the process. The trenches 9 extend from the first main surface of the epitaxial layer 5 toward the substrate 3 to a third depth position illustrated by depth $B_3$, but not necessarily all the way to the substrate 3. The width $A_3$ of each of the trenches 9 adjacent to device mesas 11 is about the same relative to the other trenches 9. Though not shown clearly, the trenches 9 are preferably wider at their tops by 1%-10% than at their bottoms to facilitate the trench fill process. Thus, the mesas 11 have sidewall surfaces with a predetermined inclination maintained relative to a first main surface of the epitaxial layer 5. After the second trenching process, the second mask 52 is removed using techniques known in the art.

The surfaces of the semiconductor substrate and/or the semiconductor layer and/or trenches 9, 17 may be smoothed, if needed, using one or more of the following process steps:
(i) an isotropic plasma etch may be used to remove a thin layer of silicon (typically 100-1000 Angstroms (Å)) from the trench surfaces.
(ii) a sacrificial silicon dioxide layer may be grown on the surfaces of the trench and then removed using an etch such as a buffered oxide etch or a diluted hydrofluoric (HF) acid etch.

The use of either or both of these techniques can produce smooth trench surfaces with rounded corners while removing residual stress and unwanted contaminates. However, where it is desirable to have vertical sidewalls and square corners, an anisotropic etch process is used instead of an isotropic etch process. Anisotropic etching, in contrast to isotropic etching, generally means different etch rates in different directions in the material being etched.

Figure 6:
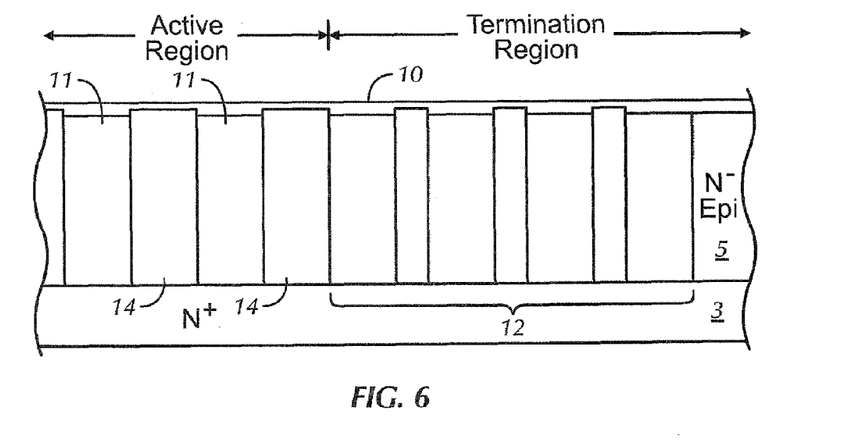
FIG. 6 is a partial sectional elevational view of the partially formed semiconductor device of FIG. 5 after an oxide fill of the trenches etched in FIG. 5.
Figure 11:
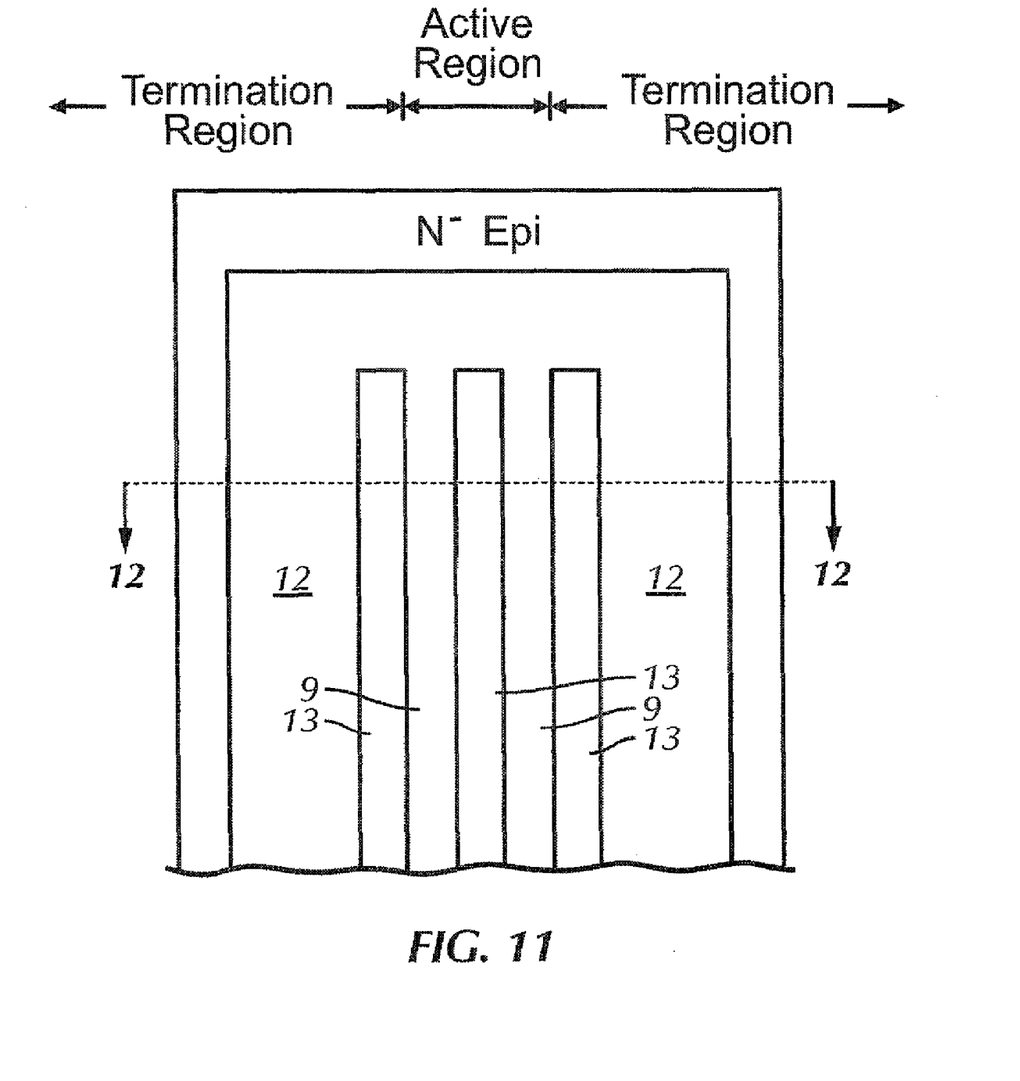
FIG. 11 is a top plan view of the partially formed semiconductor device of FIG. 10 showing mesas, trenches and wide oxide regions.

As illustrated in FIG. 6, the trenches 9, 17 in both the active and termination regions, respectively, created by the second masking and etching step shown in FIG. 5, are filled with oxide material in order to create oxide columns 14 in the active region and a relatively thick and wide oxide region 12 in the termination region (see e.g., FIG. 11 top plan view). The overall width of the oxide region 12 is on the order of 20-60 micrometers or microns (μm). A thin layer of dielectric 10, such as silicon nitride, is deposited over the oxide to reduce or eliminate any warping problems.

Figure 7:
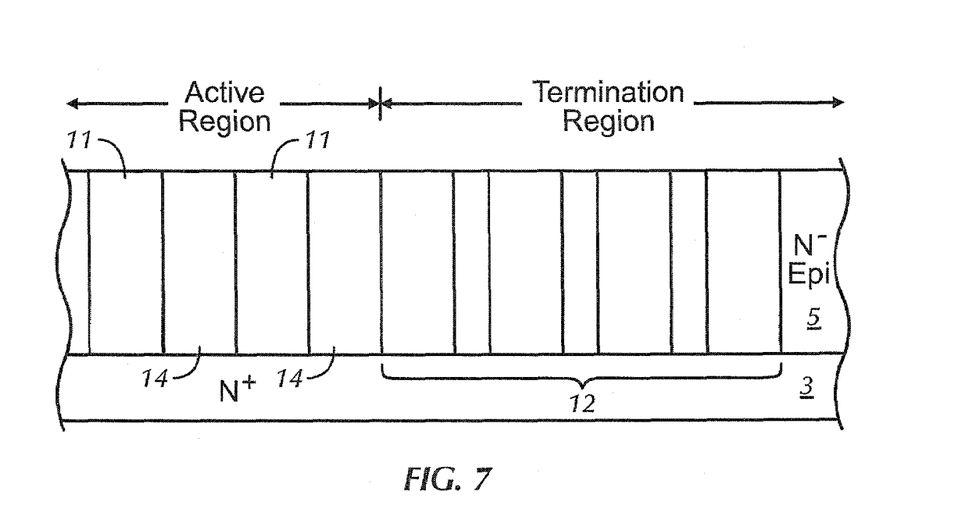
FIG. 7 is a partial sectional elevational view of the partially formed semiconductor device of FIG. 6 after planarization of the surface.
Figure 8:
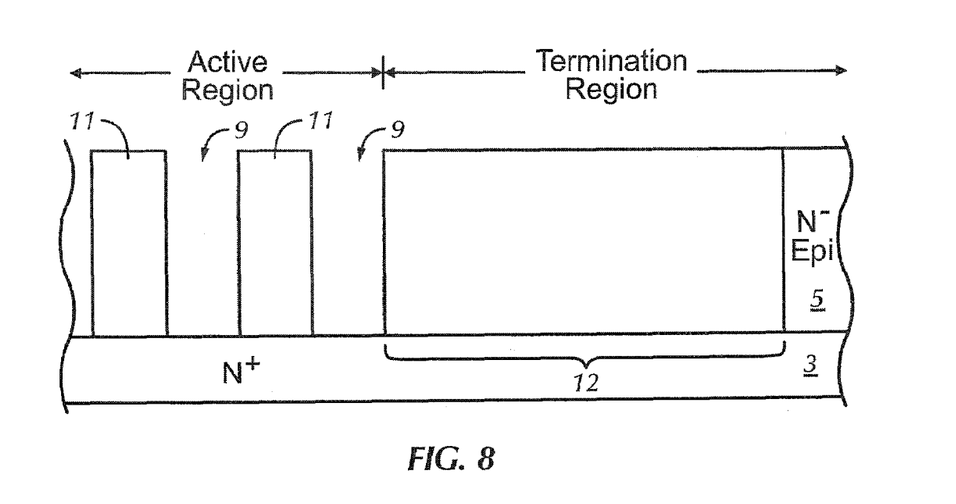
FIG. 8 is a partial sectional elevational view of the partially formed semiconductor device of FIG. 7 after masking and etching of trenches in an active region.

The surface of the partially formed semiconductor device of FIG. 6 is then planarized and the resulting partially formed semiconductor device structure is shown in FIG. 7. FIG. 8 is a resulting partially formed semiconductor device structure after masking and etching steps remove the oxide 14 that was deposited in the trenches 9 in the active region by a similar process as described above.

Figure 9:
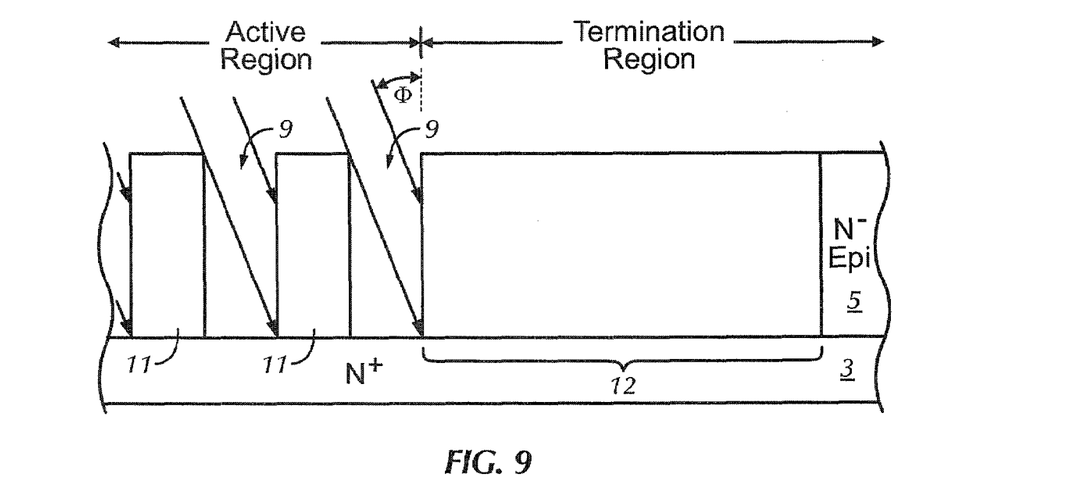
FIG. 9 is a partial sectional elevational view of the partially formed semiconductor device of FIG. 8 showing ion implantation into trench sidewalls in the active region from a first angle to begin formation of p-n junctions along the depth direction of the mesas.

FIG. 9 shows an ion implant in the structure of FIG. 8 from a first predetermined angle Φ (i.e., first predetermined angle of implant Φ). The first predetermined angle of implant Φ is determined by the width $A_3$ and depth $B_3$ of the trenches 9 (i.e., $A_3/B_3$=tangent of the implant angle Φ) which is typically from about 2° to 12° from vertical. The implant is done at an angle Φ so that the bottom of each trench 9 is not implanted. Implantation of the bottom of trenches 9 is avoided so that diffusion of the implant to surrounding areas does not occur. The implant is performed at an energy level of about 30-200 kilo-electron-volts (KeV) with dose ranges from about 1E13 to 1E14 cm$^{-2}$ (i.e., about $1\times10^{13}$ to $1\times10^{14}$ cm$^{-2}$). Consequently, a dopant of the first conductivity type is implanted, at a first predetermined angle of implant Φ, into at least one preselected device mesa 11 of the preselected area of the plurality of device mesas 11 and the plurality of trenches 9 at an adjacent pair of the plurality of trenches 9 at a sidewall surface of one trench 9, to form at the sidewall surface of the one trench 9 a first doped region of the first conductivity type having a doping concentration lower than that of the heavily doped region 3. This step begins the process of creating a p-n junction along the depth direction of the device mesas 11 in the active region.

Figure 10:
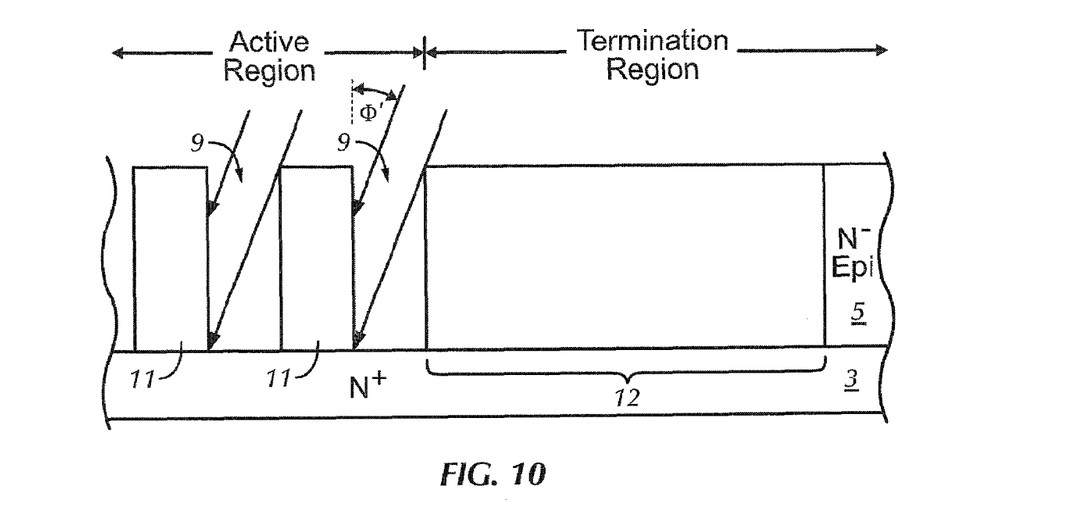
FIG. 10 is a partial sectional elevational view of the partially formed semiconductor device of FIG. 9 showing ion implantation into the trench sidewalls opposite to those implanted in FIG. 9, completing the formation of p-n junctions along the depth direction of the mesas.

FIG. 10 shows an ion implant in the structure of FIG. 9 from a second predetermined angle Φ' (i.e., second predetermined angle of implant Φ'). The second predetermined angle of implant Φ' is also determined by the width A3 and depth B3 of the trenches 9 (i.e., −(A3/B3)=tangent of the implant angle Φ') which is typically from about −2° to −12° from vertical. The implant is done at an angle Φ' so that the bottom of each trench 9 is not implanted. It should be noted that the first predetermined angle of implant Φ and the second predetermined angle Φ' may be about the same magnitude or may be different. Implantation of the bottom of trenches 9 is avoided so that diffusion of the implant to surrounding areas does not occur. The implant is performed at an energy level of about 30-200 KeV with dose ranges from about 1E13 to 1E14 cm$^{-2}$. Consequently, a dopant of the second conductivity type is implanted, at a second predetermined angle of implant Φ', into the at least one device mesa 11 of the preselected area of the plurality of device mesas 11 and the plurality of trenches 9, at a sidewall surface of the at least one device mesa 11 opposite to the sidewall implanted with the dopant of the first conductivity type to provide a second doped region of the second conductivity type at the sidewall surface opposite to the sidewall implanted with the dopant of the first conductivity type, to form a p-n junction of the first and second doped regions located along the depth direction of at least one of the plurality of trenches 9 and to provide non-implanted outer sidewalls of the active region. This implant completes the process of creating a p-n junction along the depth direction of the device mesas 11 in the active region.

The doping is performed by one of ion implantation, solid diffusion, liquid diffusion, spin-on deposits, plasma doping, vapor phase doping, laser doping or the like. Doping with boron B results in a more p-type region, doping with phosphorus P results in a more n-type region and doping with arsenic Ar results in a more n-type region. Other dopants may be utilized such as antimony Sb, bismuth Bi, aluminum Al, indium In, gallium Ga or the like depending on the material of the substrate and the desired strength of the doping. Preferably, the doping is performed by ion implantation.

Following implanting, a drive in step at a temperature of up to 1200° Celsius may be performed for up to 12 hours so that the device mesas 11 are converted to p-n columns 13. It should be recognized that the temperature and time are selected to sufficiently drive in the implanted dopant. But, the energy level used to perform ion implantation, as described above, may be high enough to sufficiently drive in the dopants without departing from the present invention.

FIG. 11 is a top plan view of the partially formed semiconductor device created by the process showing trenches 9 separating the n-p columns 13 in the active region and the wide oxide region 12 in the termination region. FIG. 11 shows one of many possible top plan views of the partially formed semiconductor device. FIG. 11 shows a stripe design (i.e., n-p columns 13 in rows and columns) instead of a polygonal cell layout, but the embodiments do not necessarily preclude a polygonal cell structure. Many other geometrical arrangements of columns 13 and trenches 9 are also contemplated without departing from the invention. The columns 13 are not limited to n-p and may be n-p-n, p-n-p, n-pp-n, p-nn-p or the like without departing from the invention.

Figure 12:
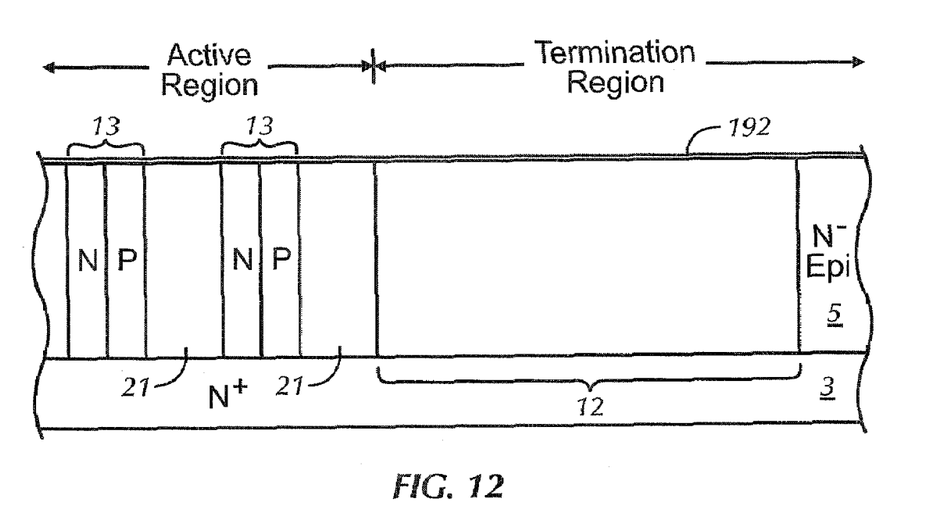
FIG. 12 is a partial sectional elevational view of the partially formed semiconductor device of FIG. 10 after filling the implanted trenches with oxide, depositing a thin layer of dielectric material such as silicon nitride to reduce or prevent warping of the surface, and planarization of the surface.

Any oxide process may be used to fill the trenches 9 with silicon dioxide (FIG. 12). The n-p columns 13 are then surrounded by the silicon dioxide 21. However, it has been found that the filling of the trenches 9 can cause the devices to warp. The warping problem can be reduced or eliminated by depositing a thin dielectric layer such as silicon nitride (e.g., $Si_xN_y$) over the oxide. FIG. 12 shows the partially formed semiconductor device of FIG. 10, after the trenches 9 in the active region have been filled with oxide 21, a thin layer 192 of a dielectric such as silicon nitride has been deposited over the oxide 21, and the surface of the partially formed semiconductor device has been planarized.

Figure 13:
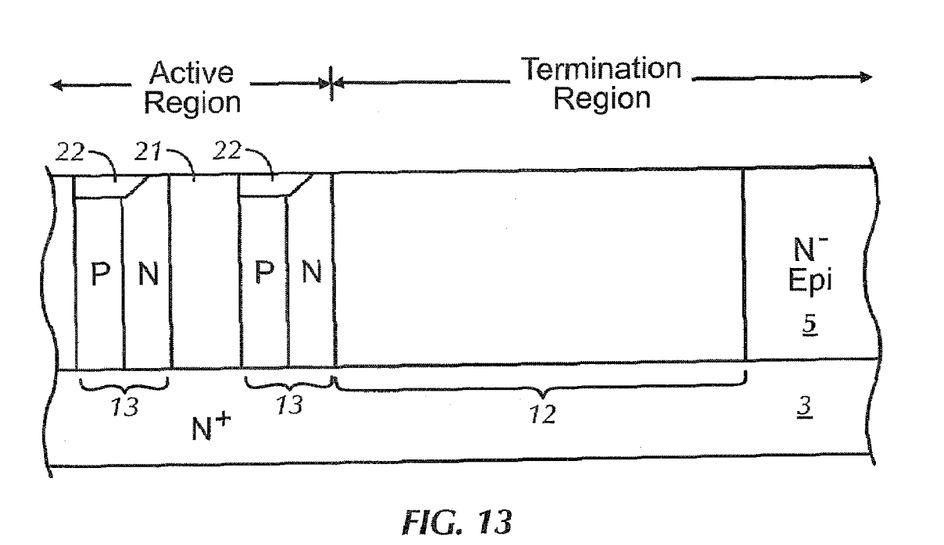
FIG. 13 is a partial sectional elevational view of the partially formed semiconductor device of FIG. 12 with a $p^+$ doped region implanted on the surface of the p-n junction.
Figure 14:
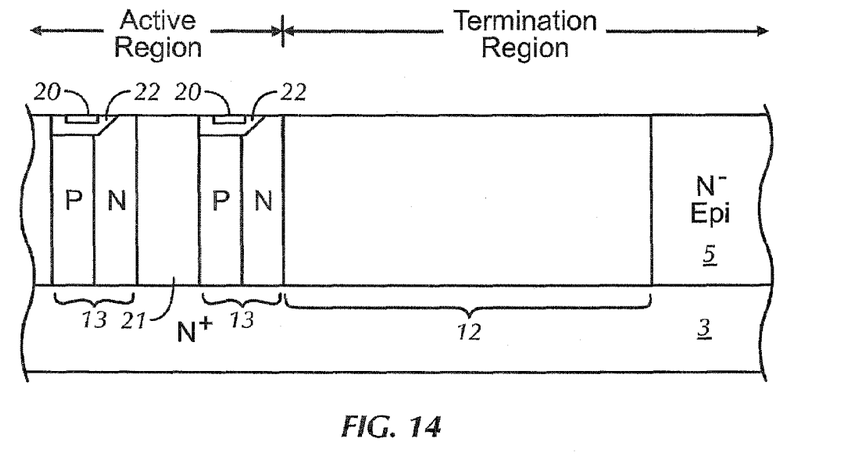
FIG. 14 is a partial sectional elevational view of the partially formed semiconductor device of FIG. 13 with an $n^+$ doped region implanted in the $p^+$ doped region.
Figure 15:
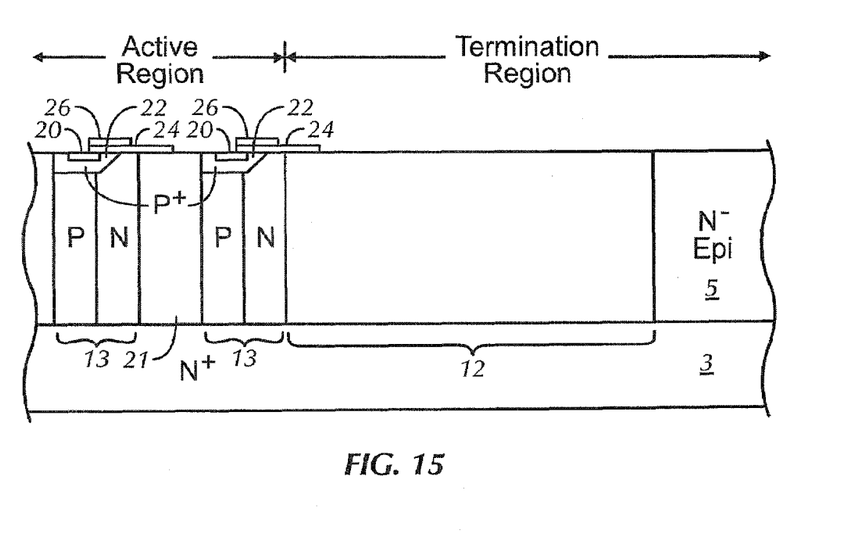
FIG. 15 is a partial sectional elevational view of the partially formed semiconductor device of FIG. 14 after a gate dielectric and a gate conductor are deposited thereon.
Figure 16:
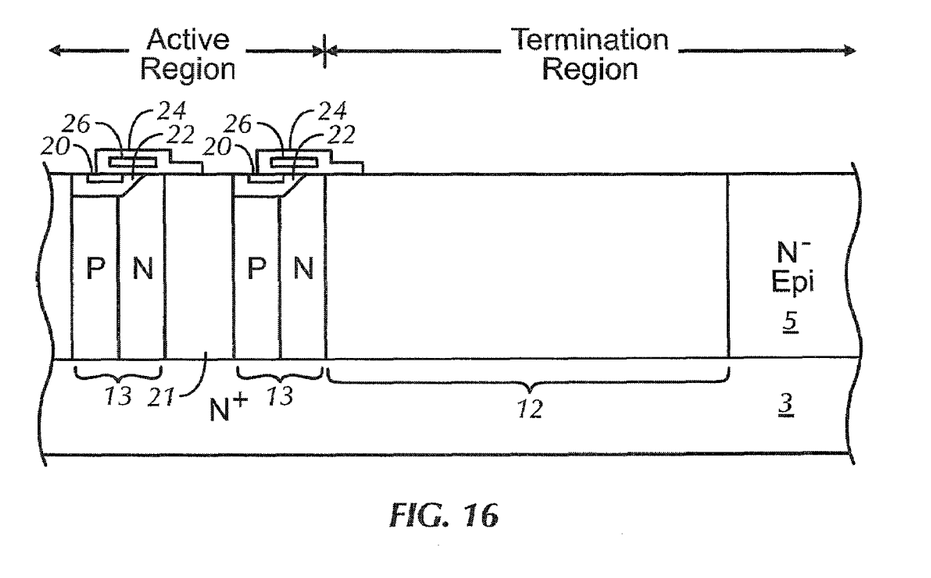
FIG. 16 is a partial sectional elevational view of the partially formed semiconductor device of FIG. 15 after an oxide deposition covers the gate conductor completing formation of a superjunction semiconductor device.

FIGS. 13-16 show the process of forming a superjunction device on the structure created above. FIG. 13 shows that a p$^+$ doped region 22 has been implanted. An n$^+$ doped region 20 formed in the p$^+$ doped region 22 is depicted in FIG. 14. The n$^+$ region 20 will serve as a source region for the superjunction device. FIG. 15 shows a gate dielectric 24 is deposited, and a gate conductor 26 deposited on the gate dielectric 24. FIG. 16 shows the gate conductor 26 has been covered with another oxide layer 24. Thus, FIG. 16 shows a superjunction device being formed on the partially formed semiconductor device of FIG. 12, using methods well known in the art. The superjunction device is now ready for completion by adding contact and passivation layers.

A passivation material may be applied to either the first or second main surfaces using one of thermal growth, low pressure (LP) chemical vapor deposition (CVD), plasma enhanced chemical vapor deposition (PECVD), Atmospheric pressure chemical vapor deposition (APCVD), spun-on-glass (SOG), glass frit, deposition, direct application and combinations thereof. The passivation material may be one of an oxide, a nitride, a glass and doped/undoped polysilicon.

The performance of devices built or formed on this structure have enhanced avalanche breakdown voltage (Vb) characteristics as compared to conventional semiconductor-transistor devices. Fabrication of conventional metal-oxide semiconductor field effect transistor (MOSFET) device(s) on the active area can then take place using well known steps. Additional steps complete the device by selectively implanting active regions of a second conductivity type followed by selectively implanting regions of a first conductivity type. Contacts to regions on the front surface and to the back surface are also made, and a passivation layer may be deposited and patterned to complete the device fabrication sequence.

Figure 17:
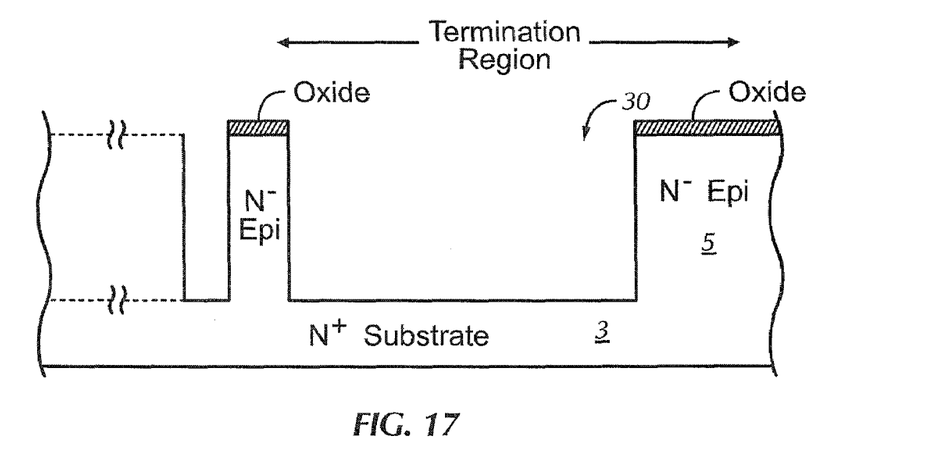
FIG. 17 is a partial sectional elevational view of the partially formed semiconductor device of FIG. 2 after a mask is applied and an etching step performed.
Figure 18:
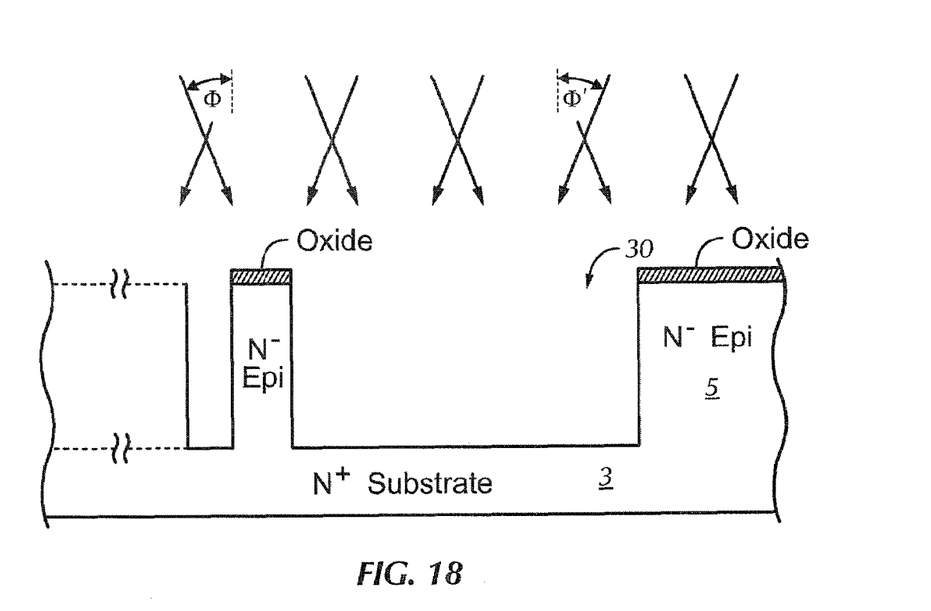
FIG. 18 is a partial sectional elevational view of the partially formed semiconductor device of FIG. 17 during ion implantation.
Figure 19:
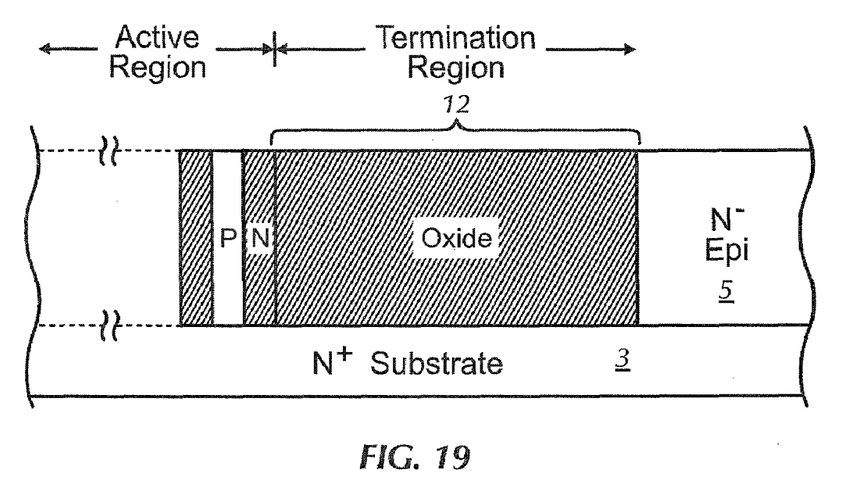
FIG. 19 is a partial sectional elevational view of the partially formed semiconductor device of FIG. 18 after trench refill.

In alternate embodiment, shown in FIGS. 17-19, a relatively wide trench 30 is formed in the termination region. The relatively wide trench 30 is approximately 20-60 μm wide. FIG. 18 shows that ion implantation may proceed, as described above with respect to FIGS. 9-10. The trench 30 is then completely refilled with oxide to form the wide oxide region 12 as shown in FIG. 19. The wide oxide region 12 is approximately 20-60 μm wide.

In another alternate embodiment, beginning at FIG. 5, only trenches 9 and 17 are formed in the first main surface to thereby define the mesas 11 and 8, respectively. The mesas 8 in the termination region have a width of about 1.0 to 1.5 micrometers (μm) and the mesas 11 in the active region have a width of about 4.0 to 5.0 μm. The method further includes forming a shallow layer of oxide on the exposed surfaces of the plurality of trenches 9 and 17 and the plurality of mesas 8 and 11 (FIG. 5), before implanting the dopants into the sidewalls of the mesas 11 in the active region. The plurality of trenches 9 and 17 are oxidized until oxidation substantially consumes each of the about 1.0 to 1.5 μm mesas 8 in the termination region. The trenches 17 remaining in the termination region should be filled by the oxidation process thereby producing the wide oxide region 12 in the termination region adjacent to the active region and to fill the remaining trenches 9 in the active region. The wide oxide region 12 is approximately 20-60 μm wide. Finally, the surface of the partially formed semiconductor device is planarized and a superjunction device is formed thereon.

Figure 20:
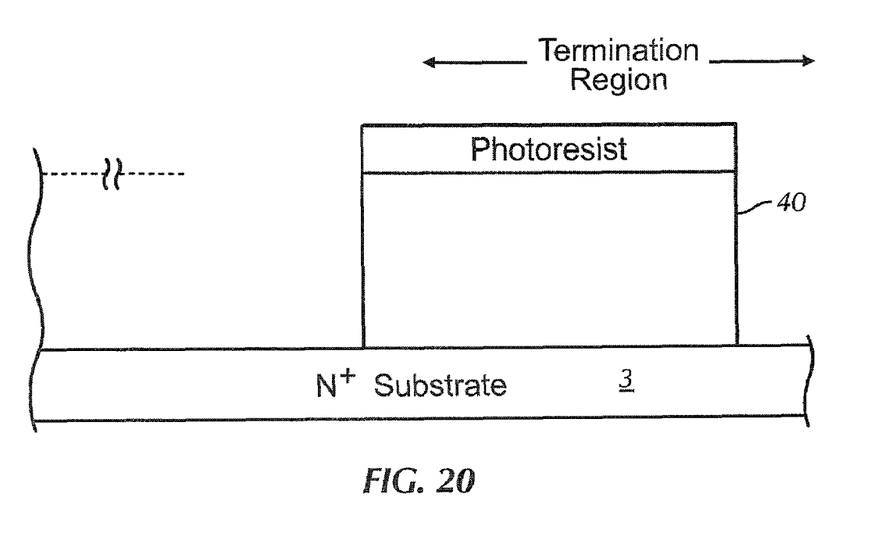
FIG. 20 is a partial sectional elevational view of an oxide wafer being bonded to a semiconductor substrate and after etching the oxide wafer.
Figure 21:
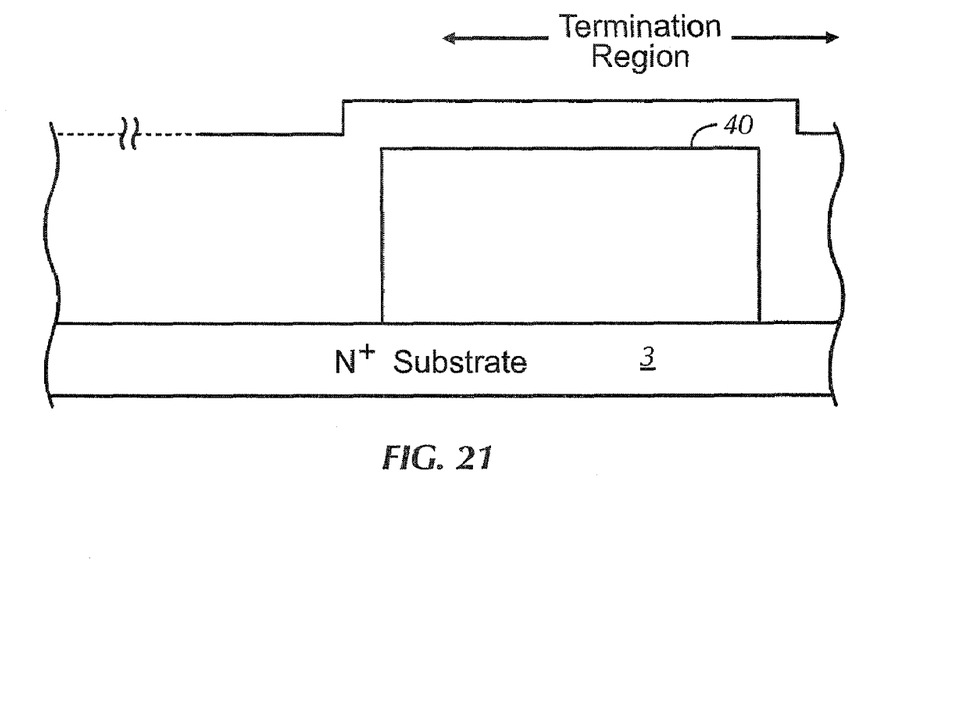
FIG. 21 is a partial sectional elevational view of the partially formed semiconductor device of FIG. 18 after epitaxial growth or other refill.
Figure 22:
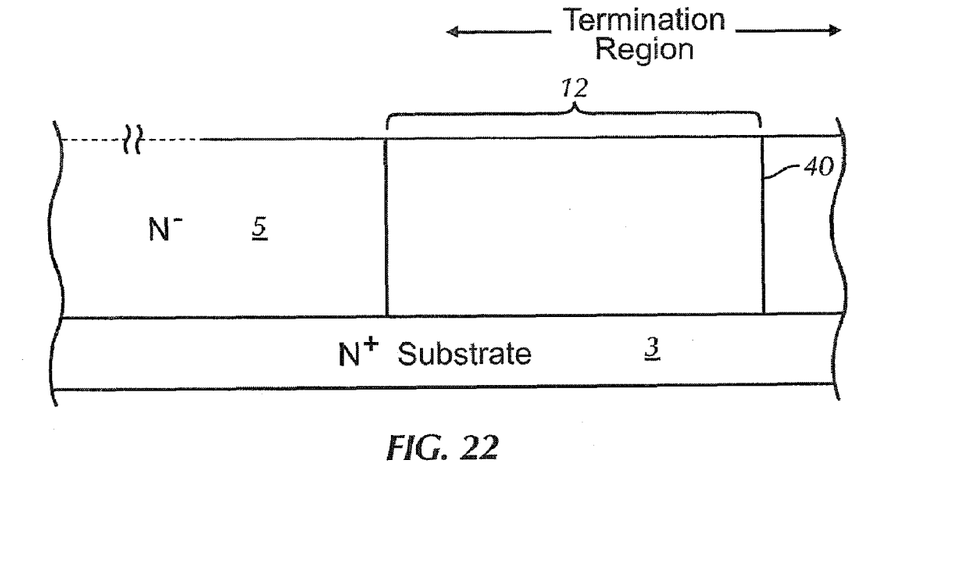
FIG. 22 is a partial sectional elevational view of the partially formed semiconductor device of FIG. 21 after planarization.

In another alternate embodiment shown in FIGS. 20-22, a silicon-on-insulator (SOI) or simply a thick oxide wafer 40 is bonded to a substrate 3. The annealing/bonding process may include heating the substrate 3 and wafers 40 in an annealing furnace for a number of minutes or hours. For example, the stacked substrate 3 and wafers 40 may be placed in an annealing furnace at 800-1200° C. for few a minutes to several hours to cause the materials to sufficiently bond. The annealing process may be performed in an inert ambient atmosphere, e.g., nitrogen gas, or in an oxidizing ambient atmosphere, e.g., pure oxygen, oxygen/nitrogen mixture, steam or the like. During a "wet" anneal, i.e., when steam is the ambient, the steam is generated using a mixture of oxygen and hydrogen typically above 800° C. Any silicon portion above the thick oxide 12 of the thick oxide wafer 40, e.g., in the case of the SOI wafer, is removed by a process such as CMP. A portion of the thick oxide wafer 40 is etched away using techniques described above for creating an active region. As shown in FIG. 21, a thick epitaxial layer 5 is grown on the substrate 3 and the remaining oxide wafer 40. FIG. 22 shows that the partially formed semiconductor device is planarized leaving a wide oxide region 12 in the termination region and the epitaxial region 5 in the active region which can be etched, implanted and refilled to create n-p columns 13 or the like as described above.

By providing a relatively wide oxide region 12 in the termination region, reverse voltage blocking is enhanced in the high voltage devices formed in the active region.

From the foregoing, it can be seen that the present invention is directed to a high voltage semiconductor device having an oxide region for enhancement of device reverse voltage blocking capability. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit.

We claim:

1. A semiconductor device having an active region and a termination region surrounding the active region, the semiconductor device formed by a method comprising:
    providing a semiconductor substrate having first and second main surfaces opposite to each other, the semiconductor substrate having a heavily doped region of a first conductivity type at the second main surface and having a lightly doped region of the first conductivity type at the first main surface;
    forming a first plurality of trenches and a first plurality of mesas in the termination region, each trench of the first plurality of trenches extending from the first main surface toward the heavily doped region to a first depth position;
    filling the first plurality of trenches in the termination region which is outside and adjacent to the active region with a first dielectric material;
    forming a second plurality of trenches in the active region and the termination region, the first plurality of trenches being formed before the second plurality of trenches, each trench of the second plurality of trenches extending from the first main surface toward the heavily doped region to a second depth position;
    filling the second plurality of trenches with a second dielectric material;
    planarizing the first main surface; and
    removing the second dielectric material from the second plurality of trenches in the active region.

2. A semiconductor device having an active region and a termination region surrounding the active region, the semiconductor device formed by a method comprising:
    providing a semiconductor substrate having first and second main surfaces opposite to each other, the semiconductor substrate having a heavily doped region of a first conductivity type at the second main surface and having a lightly doped region of the first conductivity type at the first main surface;
    forming a first plurality of trenches and a first plurality of mesas in the termination region, each trench of the first plurality of trenches extending from the first main surface toward the heavily doped region to a first depth position;
    filling the first plurality of trenches in the termination region which is outside and adjacent to the active region with a first dielectric material;
    forming a second plurality of trenches in the active region and the termination region, the first plurality of trenches being formed before the second plurality of trenches, each trench of the second plurality of trenches extending from the first main surface toward the heavily doped region to a second depth position;
    filling the second plurality of trenches with a second dielectric material;
    planarizing the first main surface;
    removing the second dielectric material from the second plurality of trenches in the active region; and
    doping at least a portion of a first sidewall of each of the second plurality of trenches in the active region with a dopant of a first conductivity; and
    doping at least a portion of a second sidewall of each of the second plurality of trenches in the active region with a dopant of a second conductivity type, the second conductivity type being opposite to the first conductivity type.

3. A semiconductor device having an active region and a termination region surrounding the active region, the semiconductor device formed by a method comprising:
    providing a semiconductor substrate having first and second main surfaces opposite to each other, the semiconductor substrate having a heavily doped region of a first conductivity type at the second main surface and having a lightly doped region of the first conductivity type at the first main surface;
    forming a first plurality of trenches and a first plurality of mesas in the termination region, each trench of the first plurality of trenches extending from the first main surface toward the heavily doped region to a first depth position;
    filling the first plurality of trenches in the termination region which is outside and adjacent to the active region with a first oxide;
    forming a second plurality of trenches in the active region and the termination region, the first plurality of trenches being formed before the second plurality of trenches, each trench of the second plurality of trenches extending from the first main surface toward the heavily doped region to a second depth position;

filling the second plurality of trenches with a second oxide;

removing the second oxide from the second plurality of trenches in the active region;

planarizing the first main surface;

forming columns of the first conductivity type and a second conductivity type in the active region, the second conductivity type being opposite to the first conductivity type, the columns extending from the first main surface toward the heavily doped region to a third depth position; and filling the second plurality of trenches in the active region with a third oxide.

* * * * *